United States Patent [19]
Suzuki

[11] Patent Number: 5,650,918
[45] Date of Patent: Jul. 22, 1997

[54] SEMICONDUCTOR DEVICE CAPABLE OF PREVENTING OCCURRENCE OF A SHEARING STRESS

[75] Inventor: Katsuhiko Suzuki, Tokyo, Japan

[73] Assignee: NEC Corporation, Tokyo, Japan

[21] Appl. No.: 346,223

[22] Filed: Nov. 22, 1994

[30] Foreign Application Priority Data

Nov. 25, 1993 [JP] Japan ................ 5-319010

[51] Int. Cl.$^6$ ................ H05K 7/02; H05K 1/16
[52] U.S. Cl. ................ 361/760; 361/762; 361/764; 361/768; 361/783; 174/52.4; 174/260; 257/690; 257/778; 257/780
[58] Field of Search ................ 174/52.3, 52.4, 174/260–264; 361/760–762, 764, 767–768, 783, 704, 709, 717–722; 257/690, 692, 697, 704, 706–707, 712–713, 723–724, 778–784; 228/179.1, 180.1, 180.21, 180.22

[56] References Cited

U.S. PATENT DOCUMENTS 5,084,961  2/1992  Yoshikawa ................ 29/840
5,090,119  2/1992  Tsuda et al. ................ 228/179

FOREIGN PATENT DOCUMENTS 1-192125  8/1989  Japan .
4-355937  12/1992  Japan .

Primary Examiner—Bot L. Ledynh
Attorney, Agent, or Firm—Foley, Hoag & Eliot LLP

[57] ABSTRACT

Conductive thermoplastic adhesive masses are formed on conductor lines on a substrate. A chip has an integrated circuit, first and second chip surfaces, and conductor bumps connected to the integrated circuit and protruded from the first chip surface. The conductor bumps are glued to the conductor lines by the conductive thermoplastic adhesive masses. A thermoplastic adhesive layer is formed on the second chip surface. A sealing thermoplastic adhesive mass is formed on the substrate. A sealing cap has an under end surface, an internal wall surface, and an internal upper surface. The internal wall and upper surfaces define a hole which receives the chip with the internal upper surface glued to the second chip surface by the thermoplastic adhesive layer and with the under end surface glued to the substrate by the sealing thermoplastic adhesive mass.

7 Claims, 5 Drawing Sheets

1

SEMICONDUCTOR DEVICE CAPABLE OF PREVENTING OCCURRENCE OF A SHEARING STRESS

BACKGROUND OF THE INVENTION

This invention relates to a semiconductor device having a chip and a sealing cap for sealing the chip.

A conventional semiconductor device of the type described is disclosed in Japanese Unexamined Patent Prepublication (Kôkai) No. 192125/1989. The conventional semiconductor device comprises a substrate, a chip, and a sealing cap. A plurality of conductor lines are formed on a principal surface of the substrate. The chip has an integrated circuit, a first chip surface, and a second chip surface. The chip further has a plurality of bumps and conductor films. The conductor films cover the bumps and are connected to the integrated circuit. The conductor films are protruded from the first chip surface.

The sealing cap has an under end surface, an internal wall surface, and an internal upper surface. The internal wall and the internal upper surfaces define a hole which receives the chip. The sealing cap has an elastic film with the elastic film glued to the internal upper surface. The under end surface is glued to the principal surface by a sealing adhesive mass with the chip pushed towards the conductor lines by the elastic film. The conductor films are brought into contact with a pressure force by an elastic force of the elastic film.

The substrate has a primary coefficient of thermal expansion. The sealing cap has a secondary coefficient of thermal expansion. When the primary coefficient of thermal expansion is extremely different from the secondary coefficient of thermal expansion, shearing stresses are caused to occur in the bumps and the conductor films by heating and cooling the chip, the substrate, and the sealing cap. Consequently, the semiconductor device is easily destroyed by the shearing stress.

Another semiconductor device is disclosed in Japanese Unexamined Patent Prepublication (Kôkai) No. 355937/1992. The conventional semiconductor device comprises the substrate, the chip, and the sealing cap. The conductor lines are formed on the principal surface. A plurality of conductor bumps are formed on the conductor lines. The chip has the integrated circuit, the first chip surface, and the second chip surface. The chip further has a plurality of conductor pads connected to the integrated circuit. The conductor pads are protruded from the first chip surface.

An adhesive layer is formed on the second chip surface. The sealing adhesion mass is formed on the principal surface. The sealing cap has the under end surface, the internal wall surface, and the internal upper surface. The internal wall and the internal upper surfaces define the hole which receives the chip with the internal upper surface glued to the second chip surface by the adhesive layer and with the under end surface glued to the principal surface by the sealing adhesive mass. The conductor pads are brought into contact with the conductor bumps by elastic forces of the conductor pads.

The substrate has the primary coefficient of the thermal expansion. The sealing cap has the secondary coefficient of thermal expansion. When the primary coefficient of the thermal expansion is extremely different from the secondary coefficient of the thermal expansion, a shearing stress is caused to occur in the conductor bumps by heating and cooling the chip, the substrate, and the sealing cap. Consequently, the semiconductor device is easily destroyed by the shearing stress.

SUMMARY OF THE INVENTION

It is therefore an object of this invention to provide a semiconductor device which can prevent occurrence of a shearing stress.

Other objects of this invention will become clear as the description proceeds.

According to an aspect of this invention, there is provided a semiconductor device which comprises (A) a semiconductor substrate having a principal surface; (B) a plurality of conductor lines formed on the principal surface; (C) a plurality of conductive thermoplastic adhesive masses formed on the conductor lines; (D) a chip having an integrated circuit, first aid second chip surfaces, and a plurality of conductor bumps connected to the integrated circuit and protruded from the first chip surface, the conductor bumps glued to the conductor lines by the conductive thermoplastic adhesive masses; (E) a conductive thermoplastic adhesive layer formed on the second chip surface; (F) a sealing thermoplastic adhesive mass formed on the principal surface; and (G) a sealing cap having an under end surface, an internal wall surface, and an internal upper surface, the internal wall and upper surfaces defining a hole which receives the chip with the internal upper surface glued to the second chip surface by the conductive thermoplastic adhesive layer and with the under end surface glued to the principal surface by the sealing thermoplastic adhesive mass.

According to another aspect of this invention, there is provided a semiconductor device which comprises (A) an insulator substrate having a principal surface; (B) a plurality of conductor lines formed on the principal surface; (C) a plurality of conductive thermoplastic adhesive masses formed on the conductor lines; (D) a chip having an integrated circuit, first and second chip surfaces, and a plurality of conductor bumps connected to the integrated circuit and protruded from the first chip surface, the conductor bumps being glued to the conductor lines by the conductive thermoplastic adhesive masses; (E) a conductive thermoplastic adhesive layer formed on the second chip surface; (F) a sealing thermoplastic adhesive mass formed on the principal surface; and (G) a sealing cap having an under end surface, an internal wall surface, and an internal upper surface, the internal wall and upper surfaces defining a hole which receives the chip with the internal upper surface glued to the second chip surface by the conductive thermoplastic adhesive layer and with the under end surface glued to the principal surface by the sealing thermoplastic adhesive mass.

DESCRIPTION OF THE PREFERRED EMBODIMENTS

Figure 1:
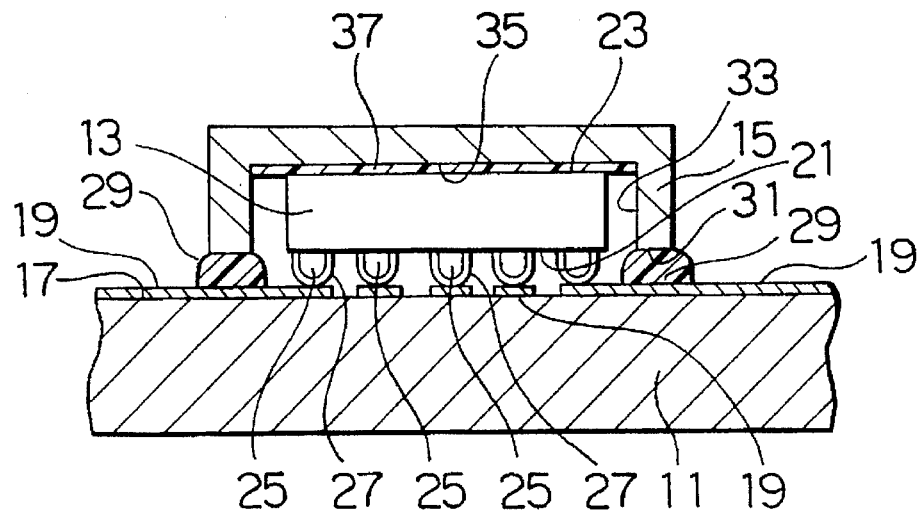
FIG. 1 is a schematic vertical sectional view of a conventional semiconductor device.

Referring to FIG. 1, a conventional semiconductor device will first be described for a better understanding of this invention.

The conventional semiconductor device is disclosed in Japanese Unexamined Patent Prepublication (Kôkai) No. 192125/1989. The conventional semiconductor device comprises a substrate 11, a chip 13, and a sealing cap 15. The substrate 11 is made of synthetic resin. The substrate 11 may be made of alumina. The substrate has a principal surface 17. A plurality of conductor lines 19 are formed on the principal surface 17. The chip 13 has an integrated circuit (not shown), a first chip surface 21, and a second chip surface 23. The chip 13 further has a plurality of bumps 25 and conductor films 27. The conductor films 27 cover the bumps 25 and are connected to the integrated circuit. The conductor films 27 are protruded from the first chip surface 21.

A sealing adhesive mass 29 is formed on the principal surface 17. The sealing cap 15 is made of metal. The sealing cap 15 has an under end surface 31, an internal wall surface 33, and an internal upper surface 35. The internal wall and the internal upper surfaces 33 and 35 define a hole which receives the chip 13. The sealing cap 15 has an elastic film 37 glued to the internal upper surface 35. The under end surface 31 is glued to the principal surface 17 by the sealing adhesive mass 29 with the chip 13 pushed towards the conductor lines 19 by the elastic film 37. The conductor films 27 are brought into contact with the conductor lines 19 by an elastic force of the elastic film 37.

The substrate 11 has a primary coefficient of thermal expansion. The sealing cap 15 has a secondary coefficient of thermal expansion. When the primary coefficient of thermal expansion is extremely different from the secondary coefficient of thermal expansion, shearing stresses are caused to occur in the bumps 25 and the conductor films 27 by heating and cooling the chip 13, the substrate 11, and the sealing cap 15. Consequently, the semiconductor device is easily destroyed by the shearing stresses.

Figure 2:
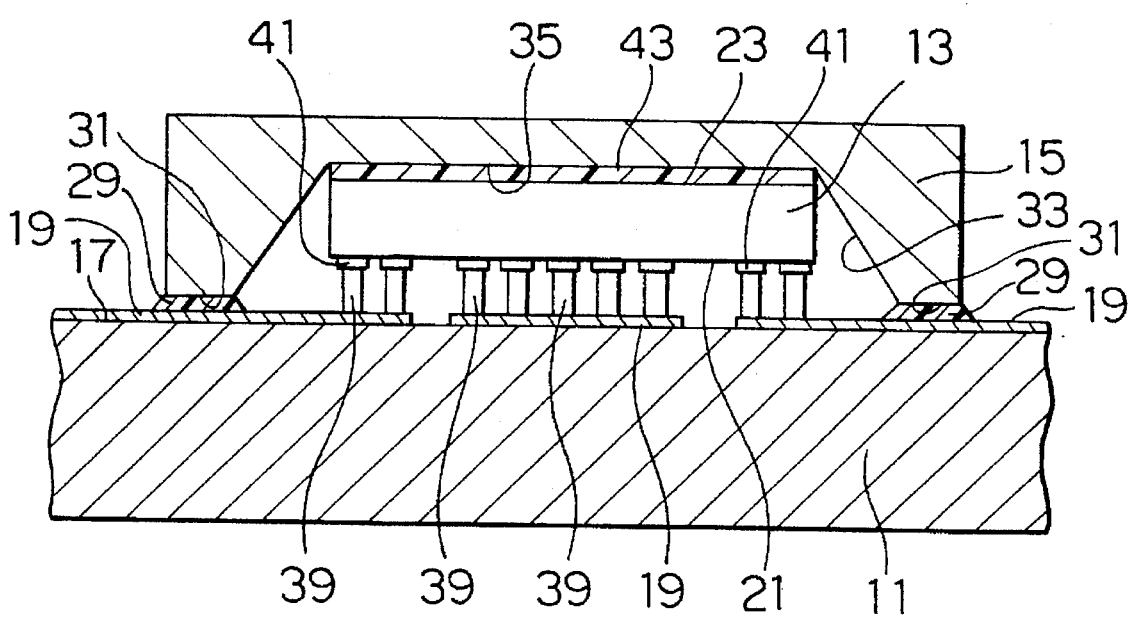
FIG. 2 is a schematic vertical sectional view of another conventional semiconductor device.

Referring to FIG. 2, another conventional semiconductor device will be described for a better understanding of this invention.

The conventional semiconductor device is disclosed in Japanese Unexamined Patent Prepublication (Kôkai) No. 355937/1992. The conventional semiconductor device comprises the substrate 11, the chip 13, and the sealing cap 15. The conductor lines 19 are formed on the principal surface 17. A plurality of conductor bumps 39 are formed on the conductor lines 19. The chip 13 has the integrated circuit, the first chip surface 21, and the second chip surface 23. The chip 13 further has a plurality of conductor pads 41 connected to the integrated circuit. The conductor pads 41 are protruded from the first chip surface 21.

An adhesive layer 43 is formed on the second chip surface 23. The sealing adhesive mass 29 is formed on the principal surface 17. The sealing cap 15 has the under end surface 31, the internal wall surface 33, and the internal upper surface 35. The internal wall and upper surfaces 33 and 35 define the hole which receives the chip 13 with the internal upper surface 35 glued to the second chip surface 23 by the adhesive layer 43 and with the under end surface 31 glued to the principal surface 17 by the sealing adhesive mass 29. In this case, the conductor pads 41 are brought into contact with the conductor bumps 39 by elastic forces of the conductor pads 41.

The substrate 11 has the primary coefficient of thermal expansion. The sealing cap 15 has the secondary coefficient of thermal expansion. When the primary coefficient of thermal expansion is extremely different from the secondary coefficient of thermal expansion, a shearing stress is caused to occur in the conductor bumps 39 by heating and cooling the chip 13, the substrate 11, and the sealing cap 15. Consequently, the semiconductor device is easily destroyed by the shearing stress.

Figure 3:
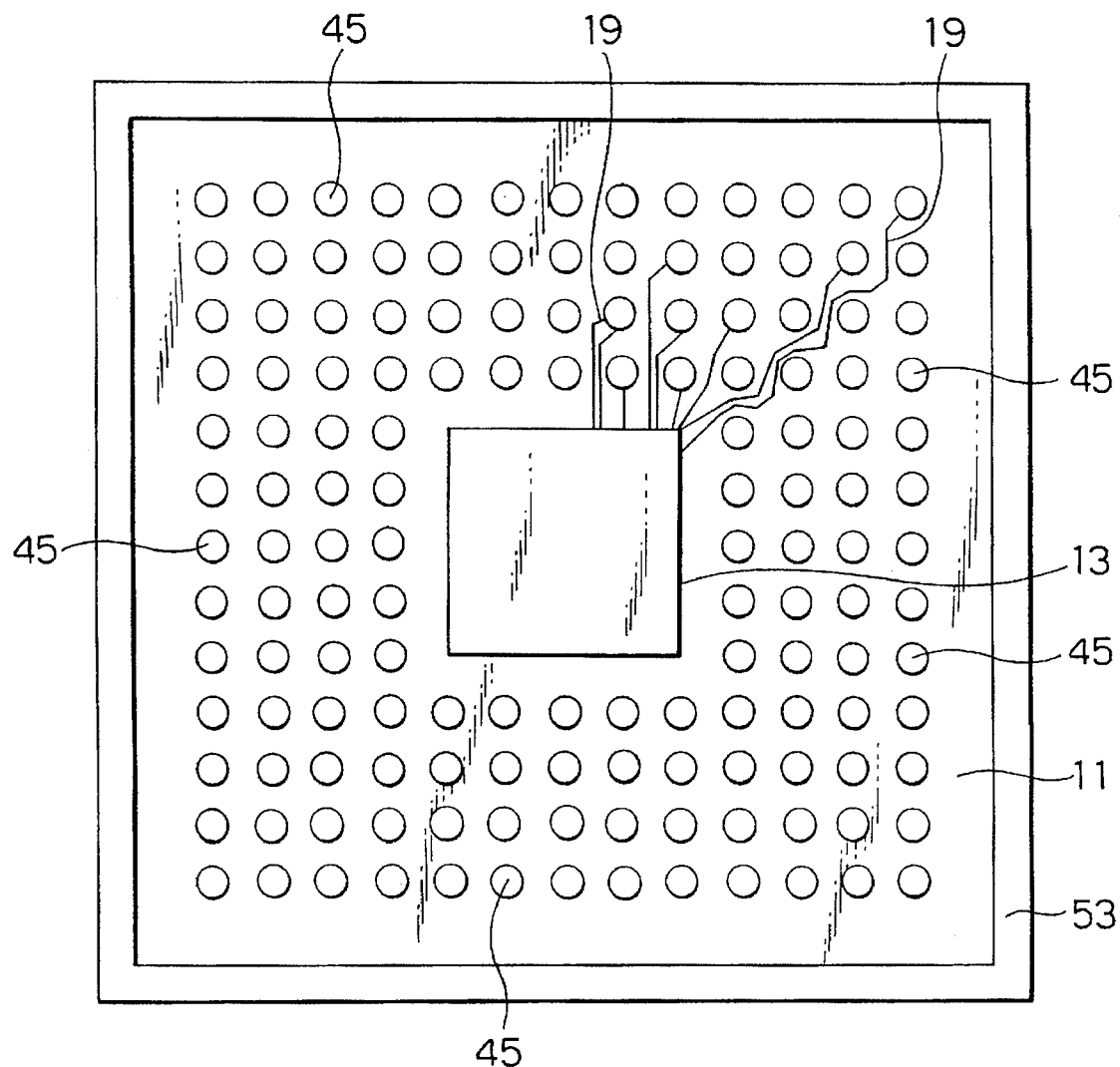
FIG. 3 is a schematic plan view of a semiconductor device according to a first embodiment of this invention with a sealing cap cut away.
Figure 4:
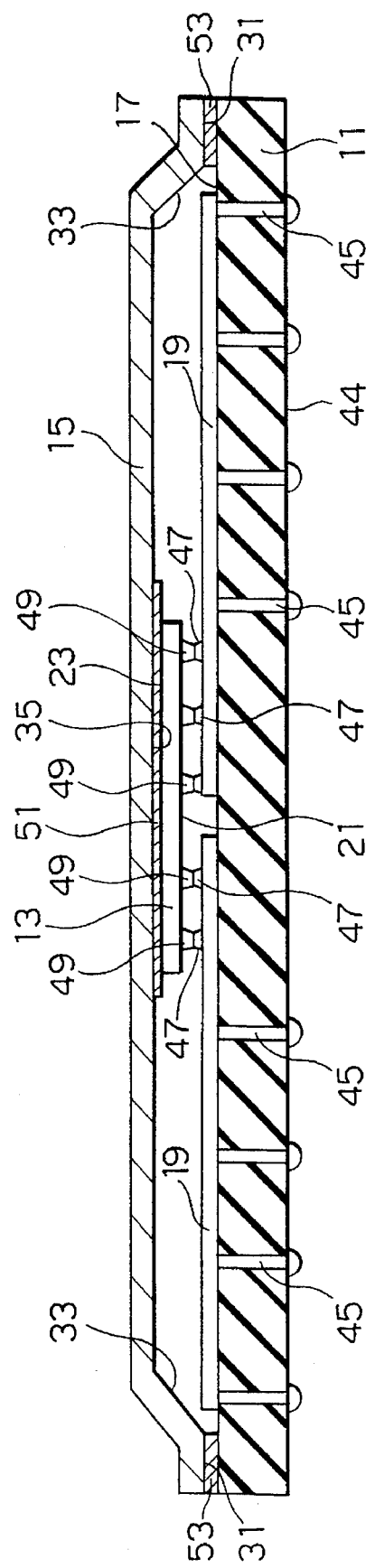
FIG. 4 is a schematic enlarged vertical sectional view of the semiconductor device illustrated in FIG. 3.

Referring to FIGS. 3 and 4, the description will proceed to a semiconductor device according to a first embodiment of this invention. Similar parts are designated by like reference numerals.

The semiconductor device comprises the substrate 11, the chip 13, and the sealing cap 15. The substrate 11 is made of insulator material. For example, the substrate 11 is made of glass epoxy resin. The Substrate 11 has the principal surface 17 and a subordinate surface 44. The substrate 11 has a plurality of through holes which reach from the principal surface 17 to the subordinate surface 44. A plurality of pin terminals 45 are inserted in the through holes of the substrate 11. The pin terminals 45 may be fixed to the substrate 11 by copper. Each of pin terminals 45 has an upper end connected to one of the conductor lines 19. Each of the pin terminals 45 has an under end protruded from the subordinate surface 44.

The conductor lines 19 are formed on the principal surface 17. A plurality of conductive thermoplastic adhesive masses 47 are formed on the conductor lines 19. The chip 13 has the integrated circuit, the first and the second chip surfaces 21 and 23, and a plurality of conductor bumps 49 connected to the integrated circuit and protruded from the first chip surface 21. The conductor bumps 49 are glued to the conductor lines 19 by the conductive thermoplastic adhesive masses 47. A thermoplastic adhesive layer 51 is formed on the second chip surface 23.

A sealing thermoplastic adhesive mass 53 is formed on the principal surface 17. The sealing cap 15 has the under end surface 31, the internal wall surface 33, and the internal upper surface 35. The internal wall and upper surfaces 33 and 35 define the hole which receives the chip 13 with the internal upper surface 35 glued to the second chip surface 23 by the thermoplastic adhesive layer 51 and with the under end surface 31 glued to the principal surface 17 by the sealing thermoplastic adhesive mass 53.

Each of the conductive thermoplastic adhesive masses 47 has a first fusing point. The thermoplastic adhesive layer 51 has a second fusing point. The sealing thermoplastic adhesive mass 53 has a third fusing point. Each of the first through the third fusing points falls within a range between 160° and 375° C., both inclusive.

Each of the conductive thermoplastic adhesive masses 47 has a first coefficient of thermal expansion. The thermoplastic adhesive layer 51 has a second coefficient of thermal expansion. The sealing thermoplastic adhesive mass 53 has a third coefficient of thermal expansion. Each of the first through the third coefficients of thermal expansion fails within a range between $230 \times 10^{-7}$ and $400 \times 10^{-7}$, both inclusive.

Each of the conductive thermoplastic adhesive masses 47 has a first coefficient of thermal conductivity. The thermoplastic adhesive layer 51 has a second coefficient of thermal conductivity. The sealing thermoplastic adhesive mass 53 has a third coefficient of thermal conductivity. Each of the first through the third coefficients of thermal conductivity falls within a range between 3 and 3.5 Watt/Meter/°C. (W/M/°C.).

For example, each of the conductive adhesive masses 47 is made of a mixture of polyurethane, ethyl sulfone, or polyhydroxyether and silver powder having a particle size which is 10 μm or less. The mixture contains 70–90% by weight of silver powder and 30–10% by weight of polyurethane, ethyl sulfone, or polyhydroxyether. Each of the thermoplastic adhesive layer 51 and the sealing thermoplastic adhesive mass 53 is made of polyurethane, ethyl sulfone, or polyhydroxyether. The sealing cap 15 is made of copper or aluminum.

Figure 5:
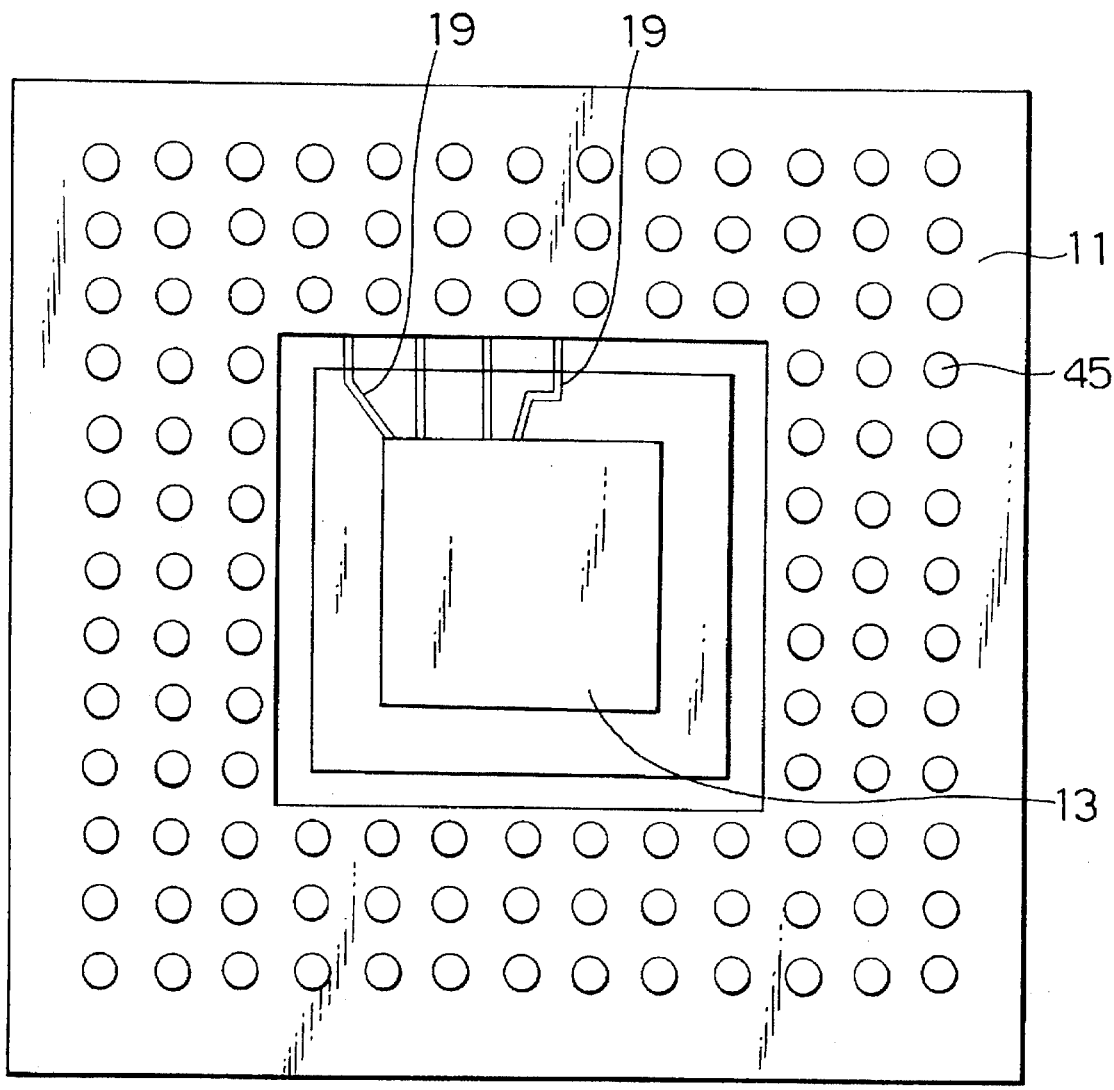
FIG. 5 is a schematic plan view of a semiconductor device according to a second embodiment of this invention with a sealing cap cut away.
Figure 6:
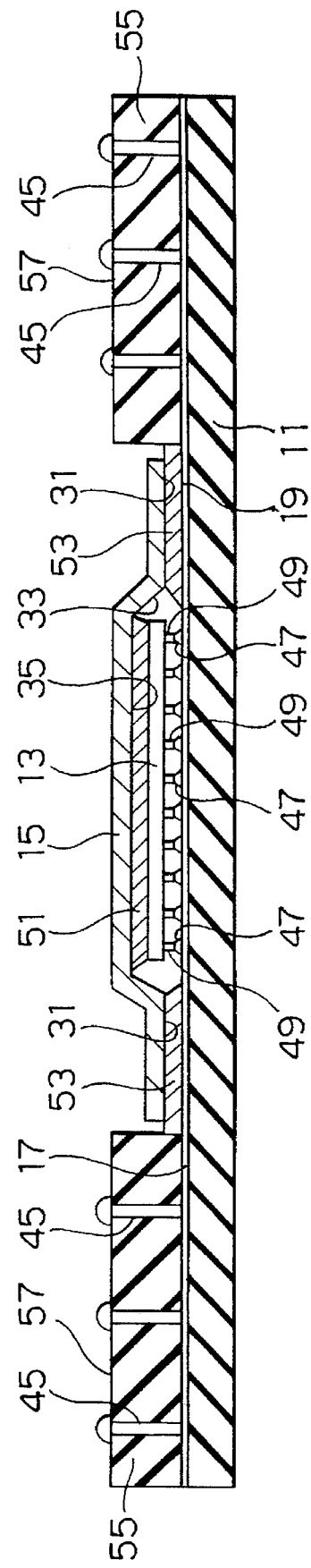
FIG. 6 is a schematic enlarged vertical sectional view of the semiconductor device illustrated in FIG. 5.

Referring to FIGS. 5 and 6, the description will proceed to a semiconductor device according to a second embodiment of this invention. Similar parts are designated by like reference numerals.

The semiconductor device further comprises an upper substrate 55 formed on the principal surface 17 of the substrate 11 and the conductor lines 19 so that the upper substrate 55 surrounds the sealing cap 15. The upper substrate 55 is made of insulator material. The upper substrate 55 has a plurality of through holes. The pin terminals 45 are inserted in the through holes of the upper substrate 55. Each of the pin terminals 45 has the under end connected to one of the conductor lines 19. Each of the pin terminals 45 has the upper end protruded from an upper surface 57 of the upper substrate 55. The substrate 11 may be made of semiconductor material, for example, silicon.

What is claimed is:

1. A semiconductor device comprising:

an insulator substrate having a principal surface;

a conductor line formed on said principal surface;

a conductive thermoplastic adhesive mass formed on said conductor line;

a chip having an integrated circuit, first and second chip surfaces, and a conductor bump connected to said integrated circuit and protruded from said first chip surface, said conductor bump being connected to said conductor line by said conductive thermoplastic adhesive mass;

a thermoplastic adhesive layer formed on said second chip surface;

a sealing thermoplastic adhesive mass formed on said principal surface; and a sealing cap having an under end surface, an internal wall surface, and an internal upper surface, said internal wall and upper surfaces defining a hole which receives said chip, wherein said internal upper surface is connected to said second chip surface by said thermoplastic adhesive layer and said under end surface is connected to said principal surface by said sealing thermoplastic adhesive mass, wherein said conductive thermoplastic adhesive mass has a first fusing point, said thermoplastic adhesive layer has a second fusing point, said sealing thermoplastic adhesive mass has a third fusing point, and each of said first, second and third fusing points falls within a range between about 160° and 375° C., both inclusive.

2. A semiconductor device as claimed in claim 1, wherein said conductive thermoplastic adhesive mass has a first coefficient of thermal expansion, said thermoplastic adhesive layer has a second coefficient of thermal expansion, said sealing thermoplastic adhesive mass has a third coefficient of thermal expansion, and each of said first, second and third coefficients of thermal expansion falls within a range between about $230 \times 10^{-7}$ and $400 \times 10^{-7}$, both inclusive.

3. A semiconductor device as claimed in claim 1, wherein said conductive thermoplastic adhesive mass has a first coefficient of thermal conductivity, said thermoplastic adhesive layer has a second coefficient of thermal conductivity, said sealing thermoplastic adhesive mass has a third coefficient of thermal conductivity, and each of said first, second and third coefficients of thermal conductivity falls within a range between about 3 and 3.5 (W/M/°C.), both inclusive.

4. A semiconductor device as claimed in claim 1, said insulator substrate being made of glass epoxy resin, and said sealing cap being made of copper.

5. A semiconductor device as claimed in claim 1, said insulator substrate being made of glass epoxy resin, and said sealing cap being made of aluminum.

6. A semiconductor device as claimed in claim 1, further comprising an upper substrate formed on said principal surface of said insulator substrate and said conductor line so that said upper substrate surrounds said sealing cap.

7. A semiconductor device as claimed in claim 6, wherein said upper substrate is formed of insulator material.

* * * * *